United States Patent
Watanabe et al.

(10) Patent No.: US 6,666,957 B2
(45) Date of Patent: Dec. 23, 2003

(54) MAGNETRON SPUTTERING SYSTEM AND PHOTOMASK BLANK PRODUCTION METHOD BASED ON THE SAME

(75) Inventors: Masataka Watanabe, Niigata-ken (JP); Satoshi Okazaki, Niigata-ken (JP); Hideo Kaneko, Niigata-ken (JP); Ken Ohashi, Fukui-ken (JP); Hideki Kobayashi, Fukui-ken (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 0 days.

(21) Appl. No.: 10/036,685

(22) Filed: Dec. 21, 2001

(65) Prior Publication Data

US 2002/0125127 A1 Sep. 12, 2002

(30) Foreign Application Priority Data

Dec. 25, 2000  (JP) ........................................ 2000-392057

(51) Int. Cl.[7] .............................................. C23C 14/35
(52) U.S. Cl. ................................. 204/192.12; 204/798.2
(58) Field of Search ........................ 204/298.19, 298.2, 204/192.12, 192.26

(56) References Cited

U.S. PATENT DOCUMENTS

| | | | | |
|---|---|---|---|---|
| 3,956,093 A | * | 5/1976 | McLeod | 204/298.2 |
| 4,891,560 A | * | 1/1990 | Okumura et al. | 204/298.19 |
| 5,182,003 A | * | 1/1993 | Maass et al. | 204/298.23 |
| 5,593,551 A | * | 1/1997 | Lai | 204/192.12 |
| 6,159,351 A | * | 12/2000 | J'Afer et al. | 204/298.19 |
| 6,352,629 B1 | * | 3/2002 | Wang | 204/298.2 |

* cited by examiner

*Primary Examiner*—Rodney G. McDonald
(74) *Attorney, Agent, or Firm*—Myers Bigel Sibley & Sajovec PA

(57) ABSTRACT

The present invention provides a magnetron sputtering system, which ensures a formation of a desired thin film, using a thick target. In the sputtering process, a portion of the target does not have erosion free portions. The present invention provides a magnetron sputtering system comprising a chamber for sputtering, a target electrode 5 installed inside said chamber, a substrate electrode 6 installed in the chamber opposite to the target electrode, a ring-shaped magnet 2 installed so as to enclose the side surface of the target electrode, and a semi-circular disk shaped magnet installed opposite to the target-mounted surface of the target electrode, wherein the semi-circular disk shaped magnet is rotated in the circumferential direction of the target electrode and is magnetized in the direction perpendicular to the target electrode. This ensures a specific magnetic field component to be generated over the thick planar target surface 3.

21 Claims, 4 Drawing Sheets

MAGNETRON SPUTTERING SYSTEM AND PHOTOMASK BLANK PRODUCTION METHOD BASED ON THE SAME

RELATED APPLICATION

This application is related to Japanese Patent Application No. 2000-392057, filed Dec. 25, 2000, the disclosure of which is hereby incorporated herein by reference.

BACKGROUND OF THE INVENTION

1. Field of the Invention

The present invention relates to a magnetron sputtering system using a planar target. The magnetron sputtering system according to the present invention is effectively used for the production of a photomask blank in a sputtering process. The photomask blank is used to produce semiconductor integrated circuits.

2. Description of the Related Art

The photomask is used in a variety of fields including the production of semiconductor integrated circuits such as ICs, LSIs and the like. The photomask is basically a light shield film mainly composed of chromium or molybdenum silicon formed on a translucent substrate with a specific pattern. In recent years, market requirements for a higher level of integration among semiconductor integrated circuits have brought about a rapid advance in the miniaturization of patterns. The miniaturization of patterns in the photomask has come to require the quality of photomask blanks to be improved. It is required to reduce defects in the photomasks, resulting from the occurrence of fine particles on the photomasks.

Under these circumstances, a planar target has been used for sputtering in the production of photomask blanks used to manufacture semiconductor photomasks. FIG. 4 shows a conventional magnetron sputtering system, and FIGS. 5 and 6 show the magnetic circuit of the conventional magnetron sputtering system. In the conventional magnetron sputtering system, a rotary magnet 11 is driven on the back surface of a target electrode 5 where a thinner target 3 is installed, and a magnetic field component parallel to the front surface of a target 3 is generated over the surface of the target 3, whereby the magnetic field is formed in the direction perpendicular to the magnetic field. This allows plasma to be trapped in the magnetic field close to the target surface, with the result that the plasma density is increased.

Chromium (Cr) or molybdenum silicide (MoSi) is normally used as a target, and sputtering gas comprising such gases as oxygen gas and nitrogen gas in addition to inactive gas is employed, so as to form a thin film on such a translucent substrate as quartz and $CaF_2$ according to the sputtering method.

The surface of the target which is eroded and positioned opposite to the substrate electrode will hereafter be called a front surface in the present disclosure.

As described above, a thin planar target has been used in the magnetron sputtering system. The cost for targets is relatively high in the production of photomask blanks. The use of thin planar targets having shorter service life makes the production cost even higher. Further, wasting a longer time in replacing the targets makes productivity poor.

To solve these problems, it has been expected to use a thicker planar target having a thickness of 15 mm or more to ensure longer service life, thereby cutting down the production cost.

In the magnetic circuit of the conventional magnetron sputtering system, however, the magnetic field does not reach a thick target surface. This makes it difficult to generate a magnetic field component parallel to the surface with a specific intensity over the entire surface of the target. If the parallel component of the magnetic field does not have a certain intensity in some portions on the surface of the target, magnetron plasma will not be produced, and sputtering does not occur in such portions. Further, if the parallel component of the magnetic field does not reach certain intensity on the target surface, some portions of the target are not eroded.

The presence of uneroded portions in the step of sputtering allows oxides or nitrides of elements constituting the target, which are fine particles deposit again on the uneroded portions. Such depositing particles will be separated from the target surface due to differences in thermal expansion where temperatures change during and after operations, and will be deposited on the thin film.

A magnetron sputtering system which makes it possible to form a high quality thin film using a thick target is desired.

The present invention has been made to solve at least some of these problems. The object of the present invention is to provide a magnetron sputtering system which generates magnetron plasma using a thick planar target having a thickness of 15 mm or more, and produce a high quality thin film.

SUMMARY OF THE INVENTION

The present inventors have designed a magnetron sputtering system which allows the magnetic field to reach the entire front surface of a thick target, and which ensures the parallel component of the magnetic field to have a specific intensity over the entire surface of the thick planar target. In other words, an improved three-dementional magnetic circuit provides a sufficient strength for the parallel component of the magnetic field so as to ensure-that magnetron plasma occurs on the target surface using a thick planar target with a thickness of 15 mm or more.

To achieve these objectives, the present invention provides a magnetron sputtering system comprising a chamber for sputtering, a target electrode installed inside the chamber, a substrate electrode installed in the chamber opposite to the target electrode, a substantially ring-shaped magnet installed enclose the side surface of the target electrode, and a substantially semi-circular disk shaped magnet installed opposite to the target-mounted surface of the target electrode, wherein the semi-circular disk shaped magnet is rotated in the circumferential direction of the target electrode and is magnetized in the direction perpendicular to the surface of the target electrode. The semi-circular disk shaped magnet and the ring-shaped magnet are preferred to be arranged in such a way that (1) an axis connecting magnetic poles of the semi-circular disk shaped magnet is perpendicular to the surface of the semi-circular disk shaped magnet, (2) the inner surface of the ring-shaped magnet is a south pole and the outer surface is a north pole when the target electrode side of the semi-circular disk shaped magnet is a north pole and the surface not in contact with the target electrode is a south pole; and (3) the inner surface of the ring-shaped magnet is a north pole and the outer surface is a south pole when the target electrode side of the semi-circular disk shaped magnet is a south pole and the surface not in contact with the target electrode is a north pole.

It is preferred that the target installed on the aforementioned target electrode is a planar target, and the aforementioned target have a thickness of 15 mm or more. It is also preferred that the aforementioned chamber comprises a reaction gas supply means.

Further, the present invention provides a photomask blank production method characterized in that films are formed by a magnetron sputtering system according to any of the above-mentioned constructions.

In the sputtering process, an erosion of the target occurs over the entire surface of the thick planar target, without generating any fine particles including oxides and nitrides re-deposited on the target. The present invention provides a high quality photomask blank without any particles generated by separation of the aforementioned fine particles.

The system of the present invention allows the parallel component of the magnetic field obtained over all-surfaces of the thick planar target, whereby the entire surface of the thick planar target can be eroded. The thick target is characterized by a lower production cost and a longer service life in producing a photomask blank. The use of the system according to the present invention generates the parallel component having a specific magnetic field on the surface of the thick target. This solves the problem that is caused by ununiform erosion of the target during the sputtering using a thick target. Further, there is no portion where the target is not eroded. This prevents from generating particles of oxides or nitrates of elements constituting the target, and allows a higher quality photomask blank to be manufactured. As described above, a higher quality photomask blank can be manufactured at a lower cost by the sputtering system according to the present invention.

DETAILED DESCRIPTION OF THE PREFERRED EMBODIMENT

Certain embodiments of the present invention will be described in the following.

The same members will be assigned with the one and same number of reference. It must be noted that the present invention is not restricted to the following embodiments.

The magnetron sputtering system according to the present invention is used to form a chromium (Cr) or molybdenum silicide (MoSi) based thin film on a translucent substrate, using a thick planar target made of chromium or molybdenum silicide.

Figure 1:
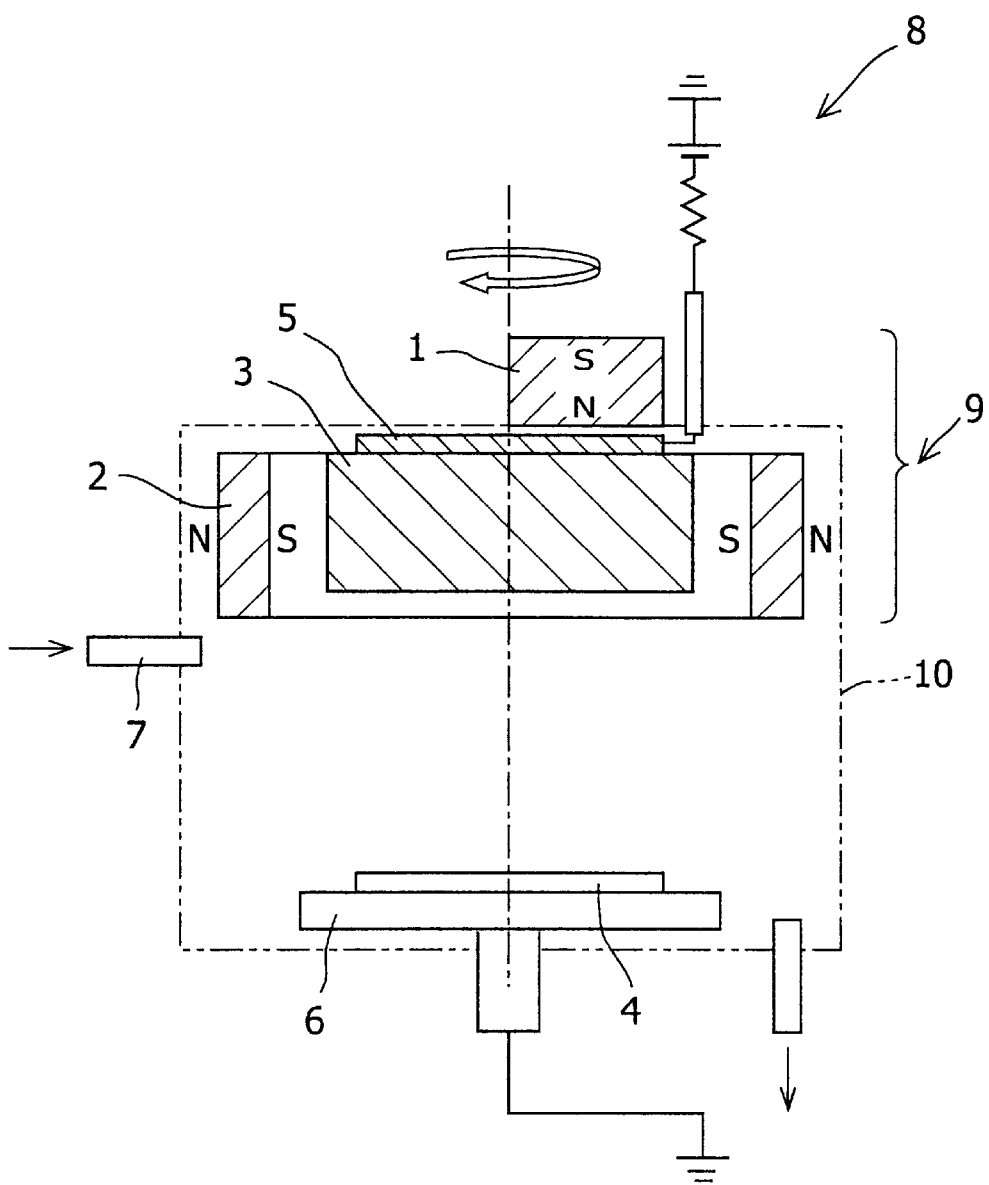
FIG. 1 is a drawing representing a magnetron sputtering system of the present invention.

FIG. 1 is a cross sectional view representing a magnetron sputtering system 8 of the present invention. A target electrode 5 for applying voltage to the surface of a target 3 is installed in the chamber 10 for sputtering, and the target 3 is adhered to the target electrode 5. A ring-shaped magnet 2 is installed so as to surround the side of the target 3 to form a magnetic circuit 9. A substrate electrode 6 is mounted at a position opposite to the target electrode 5 in such a way that a substrate 4 can be set on the substrate electrode.

Figure 2:
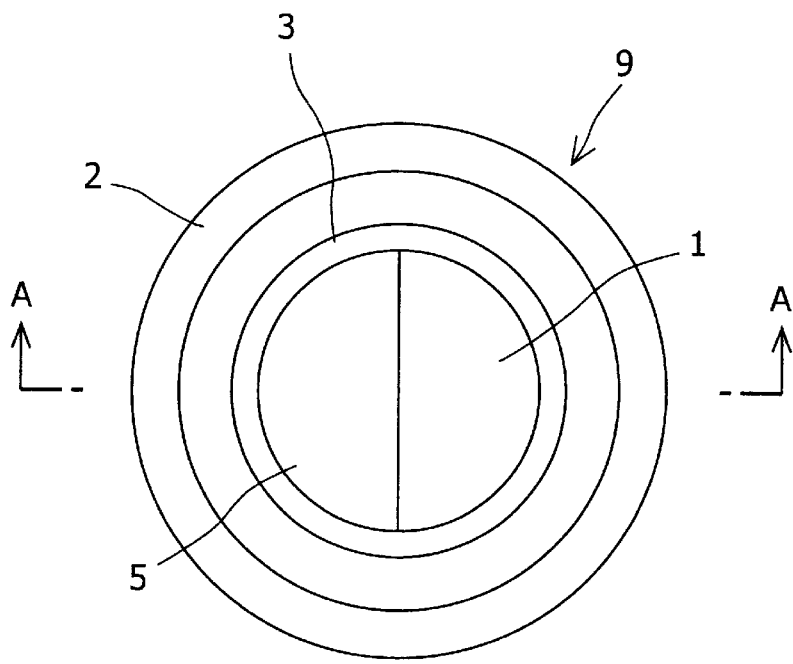
FIG. 2 is a plan view representing a magnetron sputtering system of the present invention.
Figure 3:
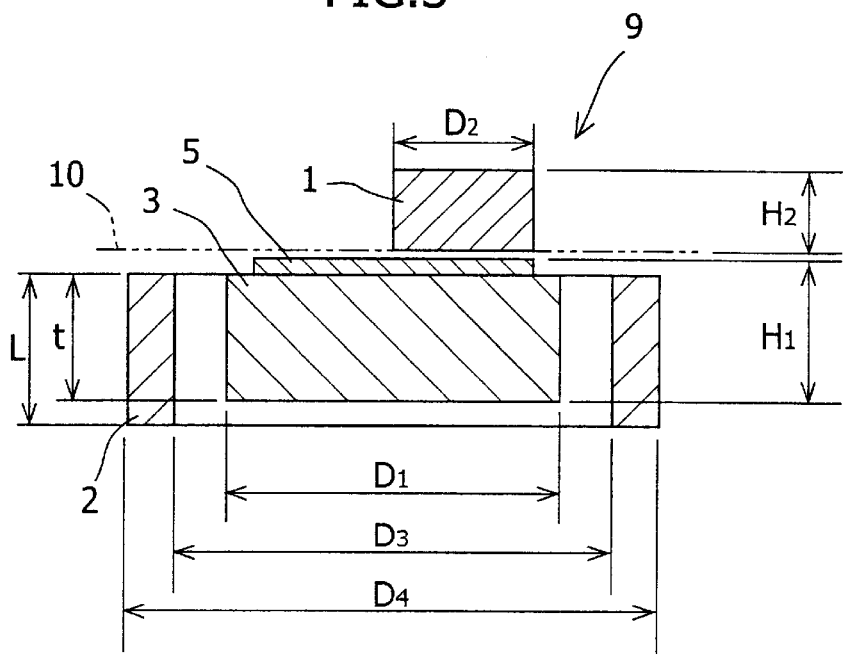
FIG. 3 is a cross sectional view along line A—A of the magnetic circuit of a magnetron sputtering system of the present invention.

FIG. 2 is a plan view showing the magnetic circuit 9 according to the present invention, and FIG. 3 is a cross sectional view of the circuit. A semi-circular disk shaped magnet 1 magnetized in the direction perpendicular to the target electrode 5 is installed rotatably around the target electrode 5, in contact with the surface opposite to the target 3 on the target electrode 5 or away from the surface. This is the magnetic circuit 9 for getting the parallel component of the magnetic field over the entire surface of the thick planar target 3. The semi-circular disk shaped magnet 1 is made to turn about the central axis of the target 3 in the circumferential direction of the target electrode 5, whereby the magnetic field of the component parallel to the surface of the target 3 is generated on to the portion of the target 3, which does not overlap with the semi-circular disk shaped magnet 1. When the magnetic field of the parallel component rotates, the magnetic field of the parallel component rotates and moves at all times on the center of the target 3. This makes it possible to eliminate erosion-free portions caused by insufficiency in the magnetic field of the parallel component at the center of the target 3.

Further, to ensure that the magnetic field reach the surface of the thick planar target 3, a ring-shaped magnet 2 is installed around the target 3 so as to surround the side of the target 3. Adjusting the length and the position of the ring-shaped magnet 2 allows the magnetic field of the parallel component to be produced on the surface of the thick planar target 3. Installation of the ring-shaped magnet 2 makes it possible to eliminate the erosion-free portions around the target 3.

The semi-circular disk shaped magnet 1 and the ring-shaped magnet 2 must be installed so that the component parallel to the target electrode 5 of the magnetic field generated by each of the magnet is oriented in the same direction. The semi-circular disk shaped magnet 1 and ring-shaped magnet 2 are preferred to be arranged in such a way that the inner surface of the ring-shaped magnet is a south pole and the outer surface is a north pole when the target electrode 5 side of the semi-circular disk shaped magnet 1 is a north pole and the surface which is not in contact with target electrode 5 is a south pole; and the inner surface of the ring-shaped magnet 2 is a north pole and the outer surface is a south pole when the target electrode 5 side of the semi-circular disk shaped magnet 1 is a south pole and the surface which is not in contact with the target electrode is a north pole.

A three-dimensional magnetic circuit 9 formed by these magnets allows the specific magnetic field of the parallel component to be generated over the surface of the thick target 3. It has been found that the generation of oxides or nitrates particles of elements constituting the target can be avoided and a higher quality thin film can be formed.

In the magnetic circuit 9, a radius of the semi-circular disk shaped magnet 1 is preferred to be 0.5 to 1.0 times larger than that of the target 3, but the radius is not restricted to this range.

It is preferred that the bottom of the ring-shaped magnet 2 on the target electrode side is installed flush with the target electrode side surface of the target 3. The inside diameter of the ring-shaped magnet 2 is preferred to be 1.05 to 1.50 times larger than that of the target 3. The height of the ring-shaped magnet is preferred to be 0.8 to 2.0 times larger than the thickness of the target 3.

However, the sizes are not restricted to the values mentioned above. The ring-shaped magnet 2 can be designed to have appropriate sizes and installed at an appropriate position so long as the specific magnetic field intensity can be obtained for the parallel component.

Further, according to one embodiment of the present invention, it is preferred that a sputtering reaction gas supply means 7 is installed in the high-vacuum chamber 10 of the system of the invention.

When sputtering is performed, the chamber 10 is kept under a high degree of vacuum while the semi-circular disk shaped magnet 1 is rotated. And a mixture of at least one of each of gases comprising carbon such as $CH_4$, $CO_2$ and CO, gases comprising nitrogen such as NO, $NO_2$ and $N_2$ and gases comprising oxygen such as $CO_2$, NO and $O_2$, and inert gases such as argon gas and krypton gas is introduced by the reaction gas supply means 7. Chromium or molybdenum silicide compounds comprising chromium or molybdenum silicides and possibly oxygen or nitrogen are used as the target 3, and Negative d.c. voltage is applied to the target 3, sputtering is carried out.

The use of the magnetic circuit 9 allows the magnetic field having the parallel component which is parallel to the target electrode 5 to occur over the entire surface of the target 3 through the rotation of the semi-circular disk shaped magnet 1. The presence of the ring-shaped magnet 2 makes it possible to supply an adittional parallel magnetic field component to the target 3 from the side of the target 3 on top of the magnetic field component from the target electrode 5. These magnets generate the parallel component of the required magnetic field intensity to the surface of the target 3, even though the thickness of the target 3 is larger. The required magnetic field eliminates erosion-free portions.

The present invention will be further described in the following with references to the embodiment, but the present invention is not limited thereto.

[Embodiment 1]

A photomask blank film was formed using the magnetron sputtering system 8 shown in FIG. 1. A planar target 3 each having a diameter $D_1$ of 76.2 mm with different thicknesses t of 6 mm, 12 mm and 18 mm was adhered on the copper electrode 5 having a thickness of thickness 5 mm. The total thicknesses $H_1$ of the electrode 5 and target 3 were 11 mm, 17 mm and 23 mm, respectively. Then a ring-shaped magnet 2 having a length L of 30 mm, an inside diameter $D_3$ of 80 mm and outer diameter $D_4$ of 90 mm was installed. Over the surface of the target electrode 5, which is opposite to the target 3, the semi-circular disk shaped magnet 1 with a radius $D_2$ of 26 mm and a height $E_2$ of 25 mm was rotated about its center position with the center axis of the target 3 coinciding the center position at 10 rpm. While the interior of the chamber 10 was kept in a high vacuum of 0.3 Pa, argon gas was introduced into the chamber 1 through a reaction gas supply means 7, and 250-watt d. c. voltage was applied to the chromium target 3. Then, sputtering was performed under these conditions. A chromium film with a thickness of 70 nm was formed on a quartz glass substrate 4. Then oxygen and nitrogen gases were introduced to form an anti-reflection film consisting of a chromium oxide/nitride film with a thickness of 30 nm. The generation of the magnetron plasma was checked and verified by an ammeter (not illustrated) installed in a voltage circuit, which is used to apply a voltage on the electrode. To examine the particles generated, a particle count tester (GM-1000 by Hitachi Engineering Co., Ltd.) was used to measure a number of fine particles with a diameter of 0.3 microns or more on the surface of the sample. The results are given in Table 1.

COMPARATIVE EXAMPLE 1

Figure 4:
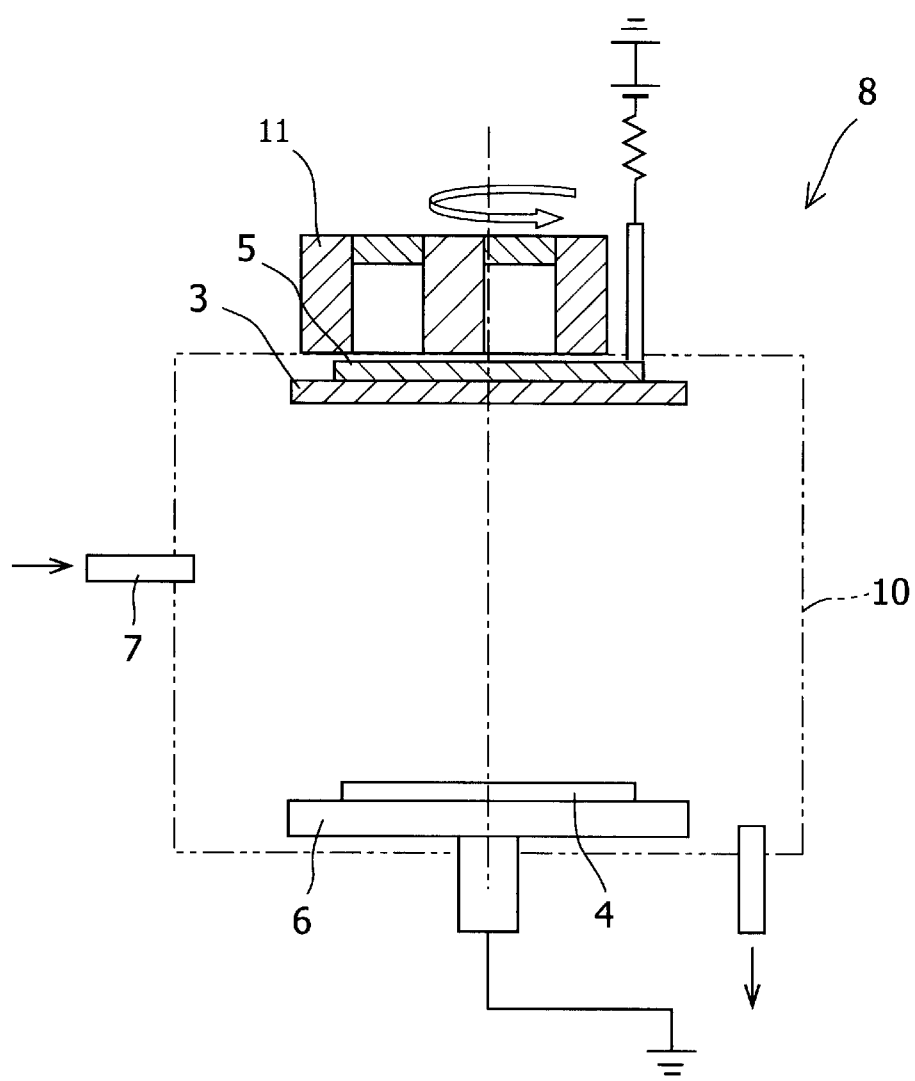
FIG. 4 is a drawing representing a conventional magnetron sputtering system.
Figure 5:
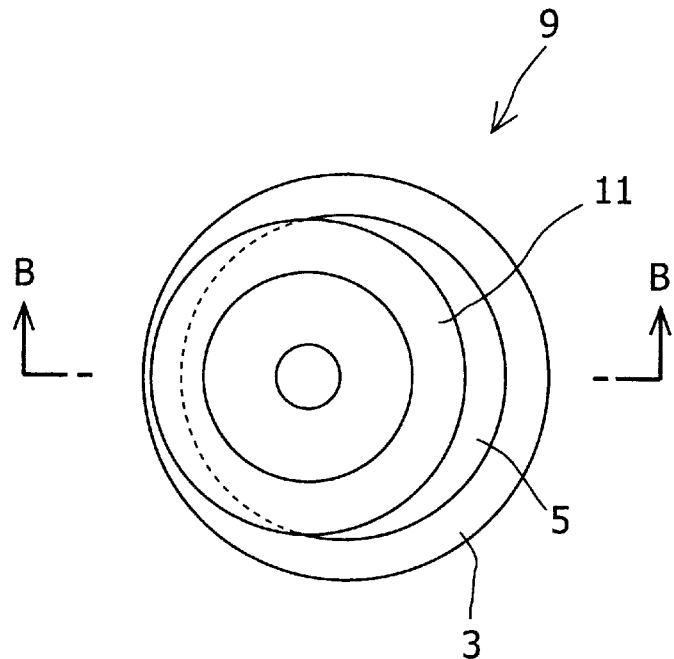
FIG. 5 is a plan view representing the conventional magnetron sputtering system.
Figure 6:
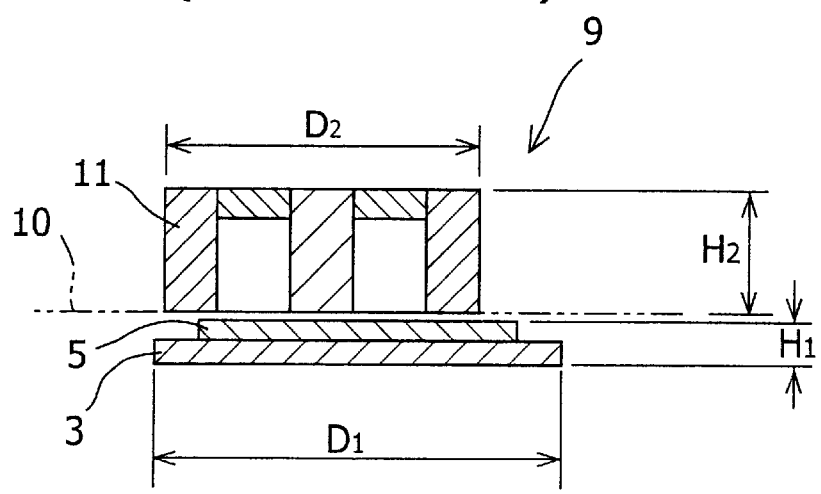
FIG. 6 is a cross sectional view along line B—B of the magnetic circuit of the conventional magnetron sputtering system.

A comparative experiment was conducted using the conventional magnetron sputtering system 8 shown in FIG. 4. A planar target 3 each having a diameter $D_1$ of 76.2 mm with different thickness t of 6 mm, 12 mm and 18 mm was adhered on the copper electrode 5 having a thickness of thickness 5 mm so that the total thickness $H_1$ of the electrode 5 and target 3 was 11 mm, 17 mm and 23 mm, respectively. On the surface of the target electrode 5 opposite to the target 3, a ring-shaped magnet 2 having a diameter $D_2$ of 52 mm and a height $H_2$ of 25 mm was installed so as to rotate in the circumferential direction, with a 10 mm offset from the center of the target 3, and was rotated at 10 rpm. Similarly to Embodiment 1, a chromium film and chromium oxide/nitride film was formed on the quartz glass substrate 4.

The generation of the magnetron plasma was identified in the same manner as in Embodiment 1. The results are given in Table 1.

TABLE 1

|  | Target thickness (mm) | Generation of magnetron plasma | Particle count |
|---|---|---|---|
| Embodiment 1 | 6 | ○ | 6 |
|  | 12 | ○ | 13 |
|  | 18 | ○ | 11 |
| Comparative example 1 | 6 | ○ | 9 |
|  | 12 | X | Film not formed |
|  | 18 | X | Film not formed |

The results given in Table 1 demonstrate that, when the magnetron sputtering system 8 equipped with the magnetic circuit 9 of the present invention is used, the magnetron plasma can be generated using a thick target 3 and excellent film formation is ensured. Further, despite increases in the thickness of the target 3 used, no increase in the number of particles or deterioration of film properties were observed. Compared to the results in the comparative example where the conventional system was used for film formation, it has been revealed that the system according to the present invention produces high quality photomask blanks with a small number of particles much the same way as in cases where thin targets are used, even through thicker targets are used.

What is claimed is:

1. A magnetron sputtering system comprising:
   a chamber for sputtering,
   a target electrode installed inside said chamber,
   a substrate electrode installed in said chamber opposite to said target electrode,
   a substantially ring-shaped magnet installed so as to enclose a side surface of said target electrode, and
   a substantially semi-circular disk shaped magnet installed opposite to a target-mounted surface of said target electrode, wherein said semi-circular disk shaped magnet is rotated in a circumferential direction of said target electrode and is magnetized in a direction perpendicular to a front surface of said target electrode.

2. The magnetron sputtering system according to claim 1 characterized in that said semi-circular disk shaped magnet and said ring-shaped magnet are arranged in such a way that:
   (1) an axis connecting magnetic poles of said semicircular disk shaped magnet is perpendicular to a front surface of said semi-circular disk shaped magnet;
   (2) an inner surface of said ring-shaped magnet is a south pole and an outer surface is a north pole when a target electrode side of said semi-circular disk shaped magnet is a north pole and a surface not in contact with said target electrode is a south pole; and (3) an inner surface of said ring-shaped magnet is a north pole and an outer surface is a south pole when a target electrode side of said semi-circular disk shaped magnet is a south pole and a surface not in contact with said target electrode is a north pole.

3. The magnetron sputtering system according to claim 1 characterized in that the target installed on a target electrode is planar.

4. The magnetron sputtering system according to claim 3 characterized in that said target has a thickness of 15 mm or more.

5. The magnetron sputtering system according to claim 1 further comprising a reaction gas supply means installed in said chamber.

6. A method for producing a photomask blank characterized in that films are formed by a magnetron sputtering system, comprising:

a chamber for sputtering, a target electrode installed inside said chamber, a substrate electrode installed in said chamber opposite to said target electrode, a substantially ring-shaped magnet installed so as to enclose a side surface of said target electrode, and a substantially semi-circular disk shaped magnet installed opposite to a target-mounted surface of said target electrode, wherein said semi-circular disk shaped magnet is rotated in a circumferential direction of said target electrode and is magnetized in a direction perpendicular to a front surface of said target electrode.

7. A magnetron sputtering system, comprising:

a target electrode;

a target being adhered to the target electrode, the target having a target sidewall, a target surface and a central axis;

a ring-shaped magnet surrounding the target sidewall; and a semi-circular magnet that is configured to rotate around the central axis of the target, wherein a magnetic field is generated on the surface of the target responsive to the rotation of the semi-circular magnet.

8. A system according to claim 7, wherein the semi-circular magnet is magnetized in a direction perpendicular to the target electrode and is configured to rotate about the central axis of the target in a circumferential direction of the target electrode.

9. A system according to claim 8, wherein the rotation of the semi-circular magnet produces a magnetic field of a component parallel to the target surface.

10. A system according to claim 9, wherein the target includes a planar surface and wherein the ring-shaped magnet is configured to provide a parallel magnetic field component that enables the magnetic field of the component parallel to the target surface to reach the surface of the planar target.

11. A system according to claim 10, wherein the ring-shaped magnet is configured such that adjusting a length and/or a position of the ring-shaped magnet enables a magnetic field to be produced on the surface of the planar surface.

12. A system according to claim 10, wherein the planar target has a thickness greater than or equal to about 15 mm.

13. A system according to claim 7, further comprising a chamber with a gas supply system disposed therein.

14. A system according to claim 13, wherein the target, the target electrode and the ring-shaped magnet are disposed in the chamber.

15. A system according to claim 7, wherein a radius of the semi-circular magnet is from about 0.5 to about 1.0 times larger than a radius of the target.

16. A system according to claim 7, wherein a diameter of the ring-shaped magnet is from about 1.05 to about 1.5 times larger than a diameter of the target.

17. A system according to claim 7, wherein a height of the ring-shaped magnet is from about 0.8 to about 2 times larger than a thickness of the target.

18. A method of forming a photomask blank film, comprising:

forming a photomask blank film using a magnetron sputtering system, wherein the magnetron sputtering system comprises:

a target electrode;

a target being adhered to the target electrode, the target having a target sidewall, a target surface and a central axis;

a ring-shaped magnet surrounding the target sidewall; and a semi-circular magnet that is configured to rotate around the central axis of the target, wherein a magnetic field is generated on the surface of the target responsive to the rotation of the semi-circular magnet.

19. A method according to claim 18, wherein the semi-circular magnet is magnetized in a direction perpendicular to the target electrode and is configured to rotate about the central axis of the target in a circumferential direction of the target electrode.

20. A method according to claim 19, wherein the rotation of the semi-circular magnet produces a magnetic field of a component parallel to the target surface.

21. A method according to claim 20, wherein the target includes a planar surface and wherein the ring-shaped magnet is configured to provide a parallel magnetic field component that enables the magnetic field of the component parallel to the target surface to reach the surface of the planar surface.

* * * * *